United States Patent [19]

Sclar

[11] Patent Number: 4,558,342
[45] Date of Patent: Dec. 10, 1985

[54] THERMOELECTRIC INFRARED DETECTOR ARRAY

[75] Inventor: Nathan Sclar, Diamond Bar, Calif.

[73] Assignee: Rockwell International Corporation, El Segundo, Calif.

[21] Appl. No.: 499,658

[22] Filed: May 31, 1983

[51] Int. Cl.[4] .......................................... H01L 35/32
[52] U.S. Cl. .................................. 357/30; 136/213; 136/225; 250/338; 357/28; 357/32
[58] Field of Search ....................... 357/30, 28, 32, 40, 357/45; 250/332, 338 SE, 370 G, 333, 338 R; 136/225, 224, 212, 213, 230

[56] References Cited

U.S. PATENT DOCUMENTS 4,111,717  9/1978  Baxter .................................. 136/213

OTHER PUBLICATIONS

Lahiji et al., "A Batch-Fabricated Silicon Thermopile Infrared Detector", Jan. 1982, pp. 14–22, IEEE Transaction on Electron Devices, vol. ED-29, No. 1.

Primary Examiner—William L. Sikes
Assistant Examiner—Georgia Y. Epps
Attorney, Agent, or Firm—H. Fredrick Hamann; Craig O. Malin

[57] ABSTRACT

The detecting element of a thermoelectric infrared detector consists of p-n junctions of a thermopile which are located on a thin layer of unsupported silicon dioxide. The silicon dioxide spans an opening which extends through a silicon semiconductor substrate. The reference junctions of the thermopile are located above the silicon substrate. The detecting p-n junctions on the thin silicon dioxide above the opening in the substrate have a low heat capacity and respond rapidly to temperature changes, whereas the reference junctions above the thick substrate have a much higher heat capacity and tend to maintain their ambient temperature. The conduction of heat between the detecting p-n junctions and the reference junctions is limited by the thin insulating layer of silicon dioxide which joins the detecting p-n junctions to the substrate under the reference junctions.

1 Claim, 6 Drawing Figures

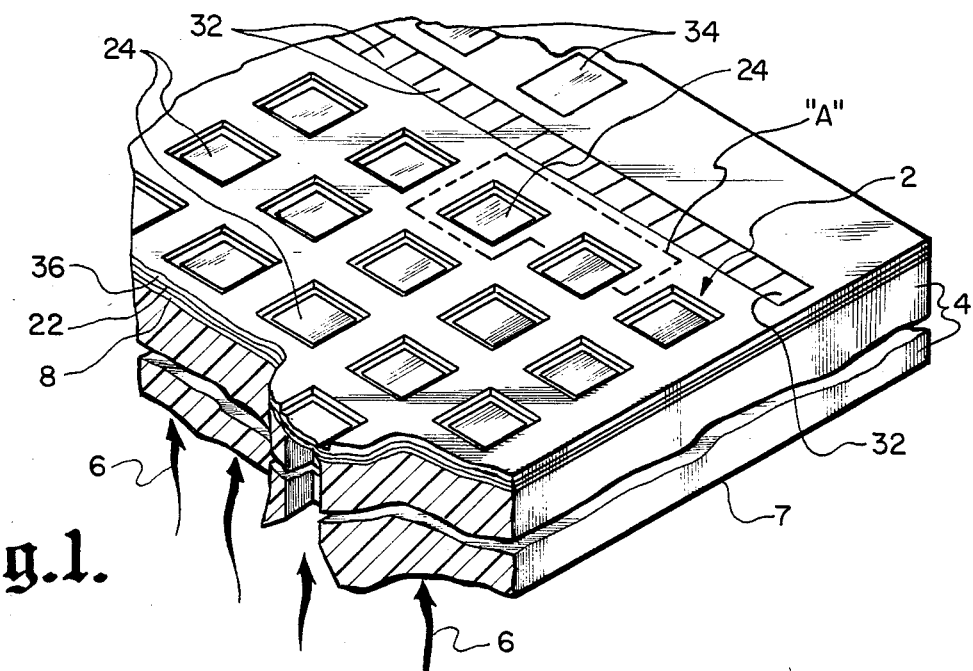
Fig.1.
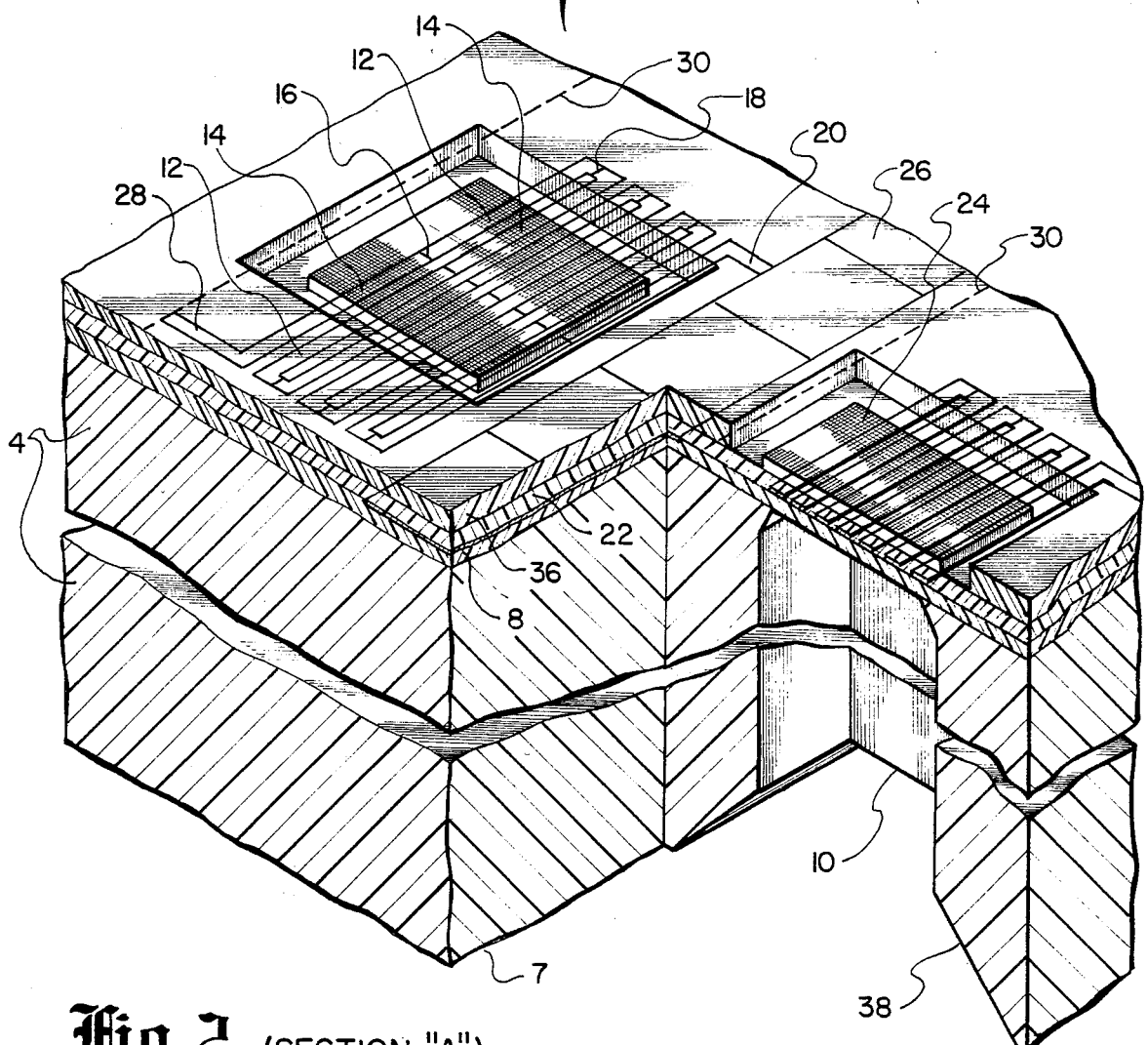
Fig.2. (SECTION "A")

THERMOELECTRIC INFRARED DETECTOR ARRAY

BACKGROUND OF THE INVENTION

This invention relates to the field of infrared (IR) detectors, and particularly to thermal-type IR detectors.

IR detectors are finding increasing use in imaging systems, particularly for military applications. State of the art systems employ photodetector arrays which must be cooled and which utilize ancillary electronics for signal processing to provide useful outputs. The arrays are assembled in hybrid fashion so that each detector is physically and electrically interfaced with an input tap on the silicon chip which contains the electronics. In order to avoid the need for cooling and to simplify and to increase the reliability of arrays, there is a need to develop different types of detectors and techniques for interfacing the detectors and the electronics.

IR detectors are conveniently divided into two catagories: (1) photon detectors, and (2) thermal detectors. In photon detectors, the incident radiation produces electronic transitions which cause a change in the distribution of the free charge carriers which in turn changes the conductivity or output voltage. Photon detectors are wavelength sensitive because the electronic transitions are energy or wavelength dependent. However, this type of detector often exhibits fast response, when trapping phenomena is not dominant, because electronic transitions occur at fast rates.

Detectors in the second broad catagory of detectors, namely thermal detectors, operate by absorbing IR radiation which causes their temperature to rise. This rise in temperature causes a change in the physical, mechanical, or electrical properties of the detecting material which can then be measured to complete the IR detection function. Thermal detectors are effective at all wavelengths provided that the material is sufficiently absorbing. They are slower than photoconductive detectors because time is required to heat or cool the detecting element.

Numerous types of thermal detectors have been proposed based upon measuring particular changes in the properties of the detecting material. This invention is a thermocouple-type detector/detector array based upon the Seebeck effect. According to the Seebeck effect, a voltage is generated between the ends of two different conductors when a temperature difference is established between their common contact (the hot junction) and their ends. For application to IR detection, the common contact is exposed to the infrared radiation to cause its temperature to change as a function of the IR radiation.

For application to IR imaging, the detectors must comprise an array of minute closely spaced independent elements with a number and spacing compatible with an acceptable IR image resolution. Further, since the outputs of the elements will be sampled by a time sequenced multiplexer, the response time of the elements must be shorter than the sequence time provided.

In order to provide rapid response and to permit satisfactory resolution, thermocouple-type detectors must be very small. Silicon integrated circuit technology permits batch fabrication of very small devices and offers the advantage of integrated circuit signal processing on the detector chip. A thermopile IR detector fabricated using silicon integrated circuit technology has been described by G. R. Lahiji and Kensall D. Wise in an article titled "A Batch-Fabricated Silicon Thermopile Infrared Detector", IEEE TRANSACTIONS ON ELECTRON DEVICES, Vol. ED-29, No. 1, January 1982, pp. 14–22. Their detector utilized bismuth-antimony or polysilicon-gold as the thermocouple materials. The "hot" junctions of the thermopile were formed by depositing these materials on a membrane forming a small window in a silicon substrate. The membrane consists of a layer of thin dielectric such as silicon dioxide on boron doped silicon. The boron doped silicon is not etched by the etchant which is used to form the openings for the windows in the silicon substrate, and it provides a support for the dielectric and for the hot junctions of the thermopiles. The boron doped silicon also increases the mass which is heated by the IR radiation and provides a path of heat loss from the hot junction to the silicon substrate. The large size of these elements, their low efficiency, and the spacing between them precludes their use for IR imaging.

SUMMARY OF THE INVENTION

It is an object of the invention to provide an IR detector and IR detector array which does not require cooling.

It is an object of the invention to provide an IR detector and IR detector array which has extended wavelength sensitivity.

It is an object of the invention to provide a thermoelectric IR detector and IR detector array having improved speed and sensitivity.

It is an object of the invention to provide an IR detector array of closely packed thermal detectors with an ancillary electronic multiplexer on a common substrate.

According to the invention, the microprocessing technology of solid state electronics is utilized to fabricate an array of thermoelectric junction IR detectors on a semiconductor substrate such as silicon. The detector is a thermopile of series-connected thermocouples, each with a hot and a cold junction. Each thermocouple of the thermopile is a line element of a semiconductor formed on a thin insulating layer above the substrate. The hot junction (or detecting junction) is a p-n junction in the line element. The substrate under the hot junctions is removed so that the hot junctions are supported by the thin insulating layer and are thermally isolated from the substrate. The cold junctions (or reference junctions) of the thermopile are located over the substrate. Thus, the detecting hot junctions and the thin supporting insulating layer have a small mass and a corresponding low heat capacity, while the cold junctions and their thick supporting substrates have a larger mass and a higher heat capacity. Additionally, the hot junctions are thermally isolated from the cold junctions by the thin thermally insulating layer.

A second thin electrically insulating layer can be deposited over the line elements of the thermopile and a black, IR-absorbing layer which defines the detector area deposited over the hot junctions.

A plurality of IR detectors are arranged in rows and columns to provide a thermoelectric imaging array. The outputs of each detector are sampled and multiplexed by an on-chip multiplexer located between the columns of detectors. The outputs of the column multiplexers are then sequentially fed into a multiplexer positioned on the edge of the chip to complete the array readout.

These and other objects and features of the invention will be apparent from the following detailed description taken with reference to the accompanying drawings.

BRIEF DESCRIPTION OF THE DRAWINGS

FIG. 1 is a perspective drawing of a partial schematic of an array of thermoelectric infrared detectors on a chip;

FIG. 2 is an enlargement of section A showing a single detector and a cross section of an adjacent detector;

DESCRIPTION OF THE PREFERRED EMBODIMENT

Figure 3:
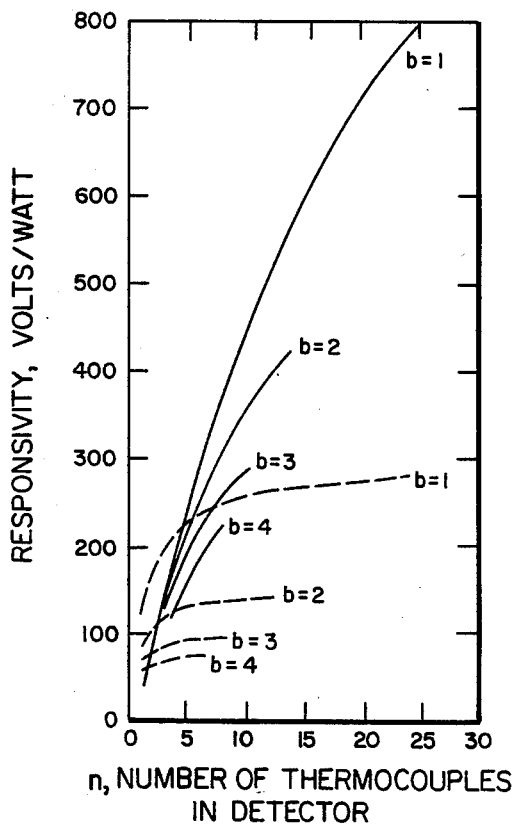
FIG. 3 shows the calculated responsivity of thermoelectric detectors having thermocouple line elements of doped silicon or of a $Si_{0.7}Ge_{0.3}$ semiconductor.

Maximum responsivity in a thermoelectric IR detector is obtained when a maximum temperature change can be realized for a given input level of IR radiation. Maximum temperature change is promoted by minimizing the mass of the detector, thermally isolating it from its surroundings, and blackening its surface to increase its absorptivity. These conditions impose severe design constraints upon the artisan, particularly for two dimensional thermal detector arrays.

The present inventor, by utilizing microelectronic integrated circuit technology, has discovered a structure which can be constructed within these severe constraints. This new structure provides a thermoelectric IR detector array having satisfactory imaging quality for many applications without requiring cooling.

FIG. 1 is a perspective view of rows of detectors 2 on a chip 4 forming a thermoelectric IR detector array according to the invention. IR radiation 6 is shown shining on the back side 7 (with respect to the circuitry on the chip) of chip 4. In an exemplary embodiment, each detector 2 is 50 μm square and is spaced 50 μm from adjacent detectors. Chip 4 utilizes a silicon wafer substrate which is 10 mils thick, has a <100> orientation, and a resistivity of about 1–10 ohm-cm.

FIG. 2 is an enlargement of Section A showing a complete detector and a cross section of a detector. The front side of chip 4 is covered with a thin (about 300 Å) layer 8 of silicon dioxide insulation. Holes 10 have been formed under the detectors. These holes extend from the back side 7 of chip 4 up to, but not through, insulating layer 8. The holes allow IR radiation 6 to shine upon the 50 μm×50 μm detector area.

A thermopile is deposited on insulating layer 8 above hole 10. The thermopile consists of line elements which extend across hole 10 and terminate above substrate 4. Each line element has a p-type conductivity portion 12 and an n-type conducting portion 14. These portions are joined over hole 10 at p-n junction 16. P-n junctions 16 are the detecting (or hot) junctions of the thermopile. The other ends of the line elements which terminate above substrate 4 are joined in series with other line elements to form the complete thermopile. These junctions 18 are shielded from IR radiation by substrate 4 and are the reference (or cold) junctions of the thermopile.

Thermocouple line elements 12, 14 are formed from semiconductors which have been doped appropriately to provide p and n elements and junctions at their contacts. Semiconductors are selected which do not adversely affect the performance of the on-chip CCDs and which can be formed in thin layers with minute line element geometries. In Table I, the properties at 300° K. of some thermoelectric semiconductors are tabulated. The values shown apply to bulk material and may differ for thin films, depending upon the deposition method employed. Efficient thermocouples require p- and n-type line elements at optimum doping concentrations which are given for the silicon and the $Si_{0.7}Ge_{0.3}$ semiconductors, but have not yet been established for the Bismuth-Antimony or for $Bi_2Te_3$ semiconductor.

Table 1 also includes the average thermocouple figure of merit ($\bar{Z}=<s^2/pK>_{p,n}$) and the specific figure of merit ($\bar{Z}/K$) for the thermoelectric array when the dominant heat leak from the detector is controlled by the thermocouple line elements themselves. The $Si_{0.7}Ge_{0.3}$ semiconductor is a preferred material for the thermocouples because of its high figure of merit, its low thermal conductivity, and because this material is most likely to provide compatibility with silicon processing.

A second 300 Å thick insulating layer 22 of silicon dioxide is deposited over thermocouple line elements 12, 14, 16, 18. A black IR-absorbing layer 24 which defines the detector area is then deposited on second insulating layer 22. Thin black absorbing layers have been formed by evaporating metallic films such as gold, bismuth and nickel in an argon atmosphere at 1–2 torr, or by depositing carbon from a flame.

TABLE I

| | THERMOELECTRIC PROPERTIES OF MATERIALS AT 300K | | | | | | | |
|---|---|---|---|---|---|---|---|---|
| | RESISTIVITY | | SEEBECK COEFFICIENT | | THERMAL CONDUCTIVITY | | AVERAGE FIGURE OF MERIT | SPECIFIC FIGURE OF MERIT |
| MATERIAL | $\rho_N$ ($10^{-3}$ ohm-cm) | $\rho_P$ | $S_N$ ($10^{-3}$ v $K^{-1}$) | $S_P$ | $K_N$ (W cm$^{-2}$ K$^{-1}$) | $K_P$ | $\bar{Z}$ ($10^{-3}$ K$^{-1}$) | $\bar{Z}/K$ ($10^{-3}$ cm W$^{-1}$) |
| Silicon $N = 1.3 \times 10^{19}$ cm$^{-3}$ $P = 2.0 \times 10^{19}$ | 5.1 | 6.0 | −0.46 | +0.42 | 1.09 | 1.00 | 0.134 | 0.128 |
| Bismuth-Antimony N—Bi P—Sb | 0.12 | 0.042 | −0.060 | +0.040 | 0.083 | 0.20 | 0.87 | 6.2 |
| Si.7Ge.3 $N = 6 \times 10^{19}$ cm$^{-3}$ $P = 2 \times 10^{19}$ | 1.05 | 0.80 | −0.168 | +0.109 | 0.051 | 0.059 | 1.5 | 27 |
| $Bi_2Te_3$ N(Cu I added) | 0.83 | 1.0 | −0.22 | +0.20 | 0.023 | 0.019 | 2.3 | 109 |

TABLE I-continued

| | THERMOELECTRIC PROPERTIES OF MATERIALS AT 300K | | | | |
|---|---|---|---|---|---|
| | RESISTIVITY | SEEBECK COEFFICIENT | THERMAL CONDUCTIVITY | AVERAGE FIGURE OF MERIT | SPECIFIC FIGURE OF MERIT |
| MATERIAL | $\rho_N \quad \rho_P$ $(10^{-3}\text{ ohm-cm})$ | $S_N \quad S_P$ $(10^{-3}\text{ v K}^{-1})$ | $K_N \quad K_P$ $(\text{W cm}^{-2}\text{ K}^{-1})$ | $\bar{Z}$ $(10^{-3}\text{ K}^{-1})$ | $\bar{Z}/K$ $(10^{-3}\text{ cm W}^{-1})$ |
| P(Bi added) | | | | | |

An important advantage of the invention is the fact that signal outputs from the thermopile detectors can be sampled and multiplexed by on-chip charge coupled device (CCD) multiplexers. Known interface circuits (such as direct, modulated gate, or fill-spill) are used to provide access from thermopile output end 20 to CCD column multiplexer 26, shown schematically, which is located in the space between detector columns. The other output end 28 of each thermopile is connected to a common contact 30.

CCD column multiplexers 26 feed into a horizontal CCD multiplexer 32 located at the edge of the chip to allow sequential readout of the detectors in the array. A protective insulating layer 36 covers the on-chip circuits and pads 34 are positioned on layer 36 along the chip edges to allow electrical contact to the array to drive and to read out the CCD multiplexers. No external contact directly to the detectors is required.

Detectors can be fabricated using photolithography, etching, vapor deposition, and other processes and materials developed for making solid state microelectronic devices. Processing of the CCD multiplexers on the chip using conventional processing methods can precede that of the detectors. The CCD structures are then overlaid with an oxide or nitride layer to provide protection from contamination during detector processing. Portions or all of the protective layer can be removed as part of the detector processing.

The detector is defined by depositing a suitable semiconducting thermoelectric film on a thin oxide layer supported by the silicon substrate. In the example of $Si_{0.7}Ge_{0.3}$, a mixture of silane ($SiH_4$) and germane ($GeH_4$) gases can be used as source materials and hydrogen as a carrier gas to deposit the desired composition on a heated substrate. The film is then doped (for example by doping during deposition or by ion implantation and annealing) and patterned by precision dry etching to achieve the desired thermopile structure and to complete electrical contacts to the inputs of the CCD. A thin oxide layer is formed over the thermopile on which a black absorbing layer is deposited and patterned to provide selective IR absorption over the hot area of the detector.

After completing detector processing, it is necessary to thermally isolate the detectors from the substrate. This can be accomplished using a two-step procedure. Holes aligned with the individual detectors are first electrolytically etched or laser drilled with near vertical walls from the back side of the substrate to within about 0.5 mil of the oxide layer on the front side. Near vertical walls are needed for detector arrays to permit close spacing of the detectors. Vertical walls would not be required for single detectors. Selective chemical etching is then used to extend the holes to the oxide layer supporting the thermopile and to provide a passageway for the infrared radiation. Several selective chemical etchants are available. One etchant is ethylene-diamine-pyrocatechol, known as EDP. This etchant removes silicon selectively at a fast rate in the 100 crystalline direction but is extremely slow in etching silicon dioxide. Thus it can be used in the second step to remove the 100 oriented silicon completely up to the thin insulating support layer of $SiO_2$.

Because selective chemical etchants have different etch rates for different crystalline directions, the vertical holes can be altered with the selective etch to provide large openings (reference #38 in FIG. 2) on the back side of the substrate and a back side channeling geometry for efficient IR collections. This provides the array with a near 100% fill factor.

The responsivity, R, of the detector is related to the width, b, and the number, n, of thermocouples in each detector as shown in FIG. 3. Responsivity is given by:

$$R = \frac{\epsilon \eta \, nS_{(pn)}}{G} \text{ in volts per watt,}$$

where $\epsilon$ is the blackbody absorptivity of the detector, $\eta$ is the efficiency of the detector signal interfacing with the CCD, n is the number of thermocouple line elements in the thermopile detector, and G is the thermal conductivity for the flow of heat from the detector to the silicon substrate.

The dominant heat flow from the detector is controlled by contributions from the thermal conductance of the isolated oxide layer and from the number of thermocouple line elements. Consequently, the cross-section dimensions of these elements as they pass across the oxide interface which separates the hot junction from the cold junction can be an important consideration. For a given oxide layer, the responsivity will increase with the number of thermocouples until the thermal conductance becomes limited by these elements, and will then tend to saturate. The saturation point depends on the thermal conductivity of the thermocouples and for a given thickness, on the width, b, of the line elements. This is shown graphically in FIG. 3 for a detector made up of 500 Å thick thermocouple line elements of doped Si (dashed lines) and for the superior $Si_{0.7}Ge_{0.3}$ (solid line).

Figure 4:
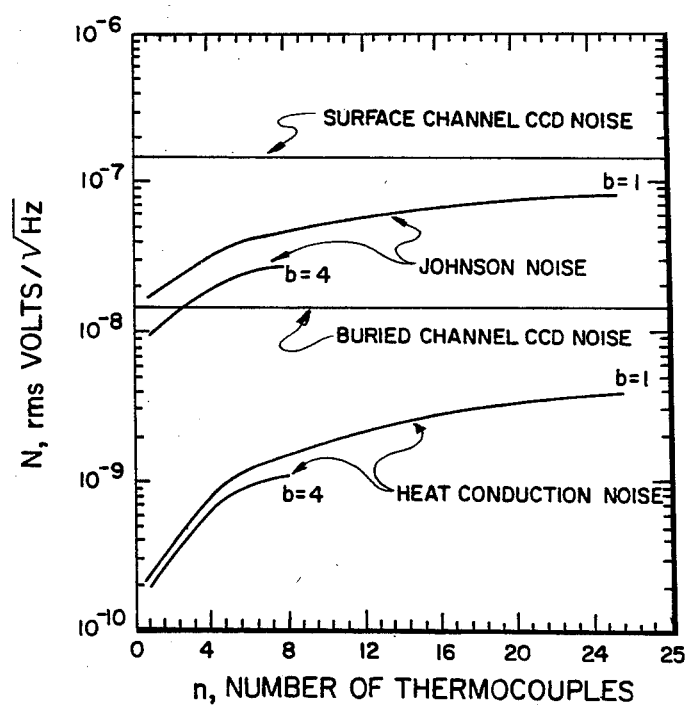
FIG. 4 shows the calculated noise contributions of a thermoelectric detector having $Si_{0.7}Ge_{0.3}$ line elements.

FIG. 4 shows the calculated amplitudes of the noise contributions which affect the performance of a $Si_{0.7}Ge_{0.3}$ detector such as described above for FIG. 3. These noises include heat conduction noise, Johnson detector noise, and representative buried channel and surface channel noises from the CCD multiplexers.

Figure 5:
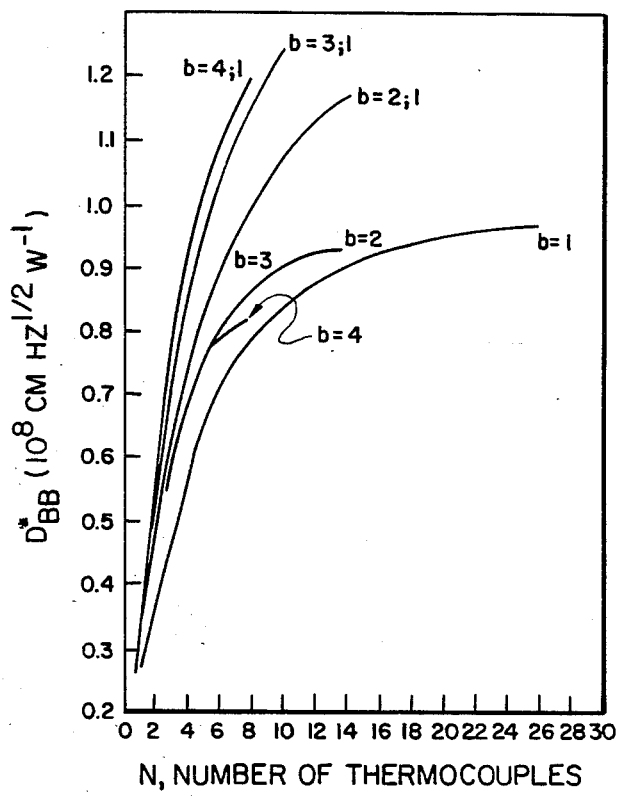
FIG. 5 shows the calculated detectivity for a $Si_{0.7}Ge_{0.3}$ detector as a function of the number and width of the line elements.
Figure 6:
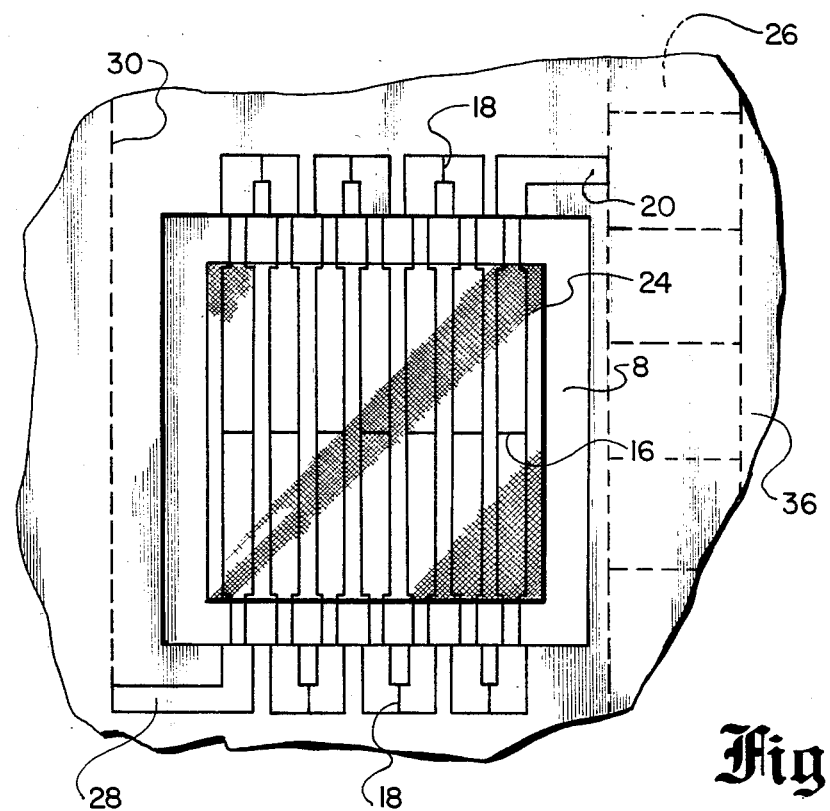
FIG. 6 is a top view of a detector thermopile having composite width line elements.

The calculated detectivity for the $Si_{0.7}Ge_{0.3}$ detector, based on the responsivity and the rms sum of the noise contributions, using the buried channel CCD multiplexer, is shown in FIG. 5 as a function of the number and width of the thermocouples. Higher performance is indicated for a composite width (double notation), where a given width is reduced to 1 $\mu$m as it passes over the oxide separating the hot and cold junctions of the detector as shown in FIG. 6. Width widths reduce the Johnson detector noise and the 1 $\mu$m width over the oxide reduces heat leak from the detector.

As shown in FIG. 5, best performance is obtained in a 50 μm detector using 9 thermocouples with a composite line width, b, of 3;1. Line resolution of approximately 1 μm can be obtained using direct step on wafer lithography and dry reactive ion etching. However, the yield obtained for such fine line processing at the present time is predictably low. Increasing the line width and avoiding the use of a composite line width geometry will increase the expected yield. Present processing technology can provide a higher yield of thermopile detectors using 7 thermocouples which are 4 μm wide. The performance of such detectors is below optimum but is still acceptable for some application.

Numerous variations and modifications can be made without departing from the invention. Accordingly, it should be understood that the form of the invention described above is illustrative only and is not intended to limit the scope of the invention.

What is claimed is:

1. A thermoelectric infrared detector array comprising:
   a silicon substrate having an array of holes extending through it from a back side to a front side;
   a thin layer approximately 300Å thick of unsupported silicon dioxide insulator extending over said holes on said front side of said substrate;
   p-n junctions of a thermopile on said thin layer over said holes, said thermopile comprising:
   a plurality of p-type, line element semiconductors, one end of each p-type semiconductor being located on said insulator over said hole and the other end being located over said substrate;
   a plurality of n-type, line element semiconductors, one end of each of n-type semiconductor being located on said insulator over said hole and the other end being located over said substrate;
   said one end of said p- and n-type semiconductors being coupled together to form said p-n junctions of said thermopile and said other ends of said p- and n-type semiconductors being coupled together to place said p-n junctions in series;
   a second thin layer of insulator covering said plurality of p- and n-type semiconductors;
   an infrared absorbing material covering a portion of said second thin layer of insulator over said hole but separated by a space from the edge of said substrate, said line elements having a first width under said absorbing material and a narrower second width in said space between said absorbing material and said substrate;
   said detector array including processing integrated circuits on said front side of said substrate, said processing electronics being coupled to the output of each thermopile, whereby the individual output from each detector can be processed to provide a signal output from said array.

* * * * *